United States Patent
Li et al.

(10) Patent No.: US 12,400,568 B2
(45) Date of Patent: Aug. 26, 2025

(54) DISPLAY PANEL

(71) Applicant: WUHAN CHINA STAR OPTOELECTRONICS TECHNOLOGY CO., LTD., Hubei (CN)

(72) Inventors: Mingyue Li, Hubei (CN); Chao Tian, Hubei (CN); Fei Ai, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 18/249,250

(22) PCT Filed: Feb. 28, 2023

(86) PCT No.: PCT/CN2023/078686
§ 371 (c)(1),
(2) Date: Apr. 15, 2023

(87) PCT Pub. No.: WO2024/159568
PCT Pub. Date: Aug. 8, 2024

(65) Prior Publication Data
US 2025/0087124 A1 Mar. 13, 2025

(30) Foreign Application Priority Data

Jan. 31, 2023 (CN) .......................... 202310099195.9

(51) Int. Cl.
*G09G 5/00* (2006.01)
*G09G 3/20* (2006.01)
(Continued)

(52) U.S. Cl.
CPC ............. *G09G 3/20* (2013.01); *H10D 86/441* (2025.01); *H10D 86/60* (2025.01); *G09G 2310/0267* (2013.01); *H10D 86/481* (2025.01)

(58) Field of Classification Search
CPC ............... G09G 3/3266; G09G 3/3648; G09G 2300/043; G09G 2310/0232;
(Continued)

(56) References Cited

U.S. PATENT DOCUMENTS 10,627,683 B2 * 4/2020 Gao ...................... G09G 3/3648
10,692,438 B2 * 6/2020 Yang .................... G09G 3/3225
(Continued)

FOREIGN PATENT DOCUMENTS

CN 107221536 A 9/2017
CN 107610636 A 1/2018
(Continued)

OTHER PUBLICATIONS

International Search Report in International application No. PCT/CN2023/078686, mailed on Aug. 6, 2023.
(Continued)

*Primary Examiner* — Joe H Cheng
(74) *Attorney, Agent, or Firm* — PV IP PC; Wei Te Chung

(57) ABSTRACT

The present application discloses a display panel, the display panel includes an active area and a irregular-shaped area, the active area includes a first active area disposed at at least one side of the irregular-shaped area and a second active area connected with the first active area. The first signal line is disposed in the second active area, the second signal line is disposed in the first active area, the first signal line and the second signal line extend in a same direction, and the length of the first signal line is larger than the length of the second
(Continued)

signal line, and at least one of a plurality of the compensation units is connected with the second signal line.

18 Claims, 6 Drawing Sheets

(51) Int. Cl.
  *H10D 86/40* (2025.01)
  *H10D 86/60* (2025.01)
(58) Field of Classification Search
  CPC ... G09G 2310/0267; G09G 2310/0286; G09G 2320/0233
  See application file for complete search history.

(56) References Cited

U.S. PATENT DOCUMENTS

| | | | | |
|---|---|---|---|---|
| 10,797,085 | B2* | 10/2020 | Qin | H10D 86/441 |
| 10,923,037 | B2* | 2/2021 | Zhu | G09G 3/3266 |
| 11,011,119 | B2* | 5/2021 | Fan | G09G 3/3258 |
| 2017/0249896 | A1* | 8/2017 | Kim | H10K 59/88 |
| 2017/0301280 | A1* | 10/2017 | Ka | G09G 3/3406 |

FOREIGN PATENT DOCUMENTS

| | | |
|---|---|---|
| CN | 107611142 A | 1/2018 |
| CN | 108269516 A | 7/2018 |
| CN | 108877658 A | 11/2018 |
| CN | 208141719 U | 11/2018 |
| CN | 109283726 A | 1/2019 |
| CN | 209843713 U | 12/2019 |
| CN | 111261640 A | 6/2020 |

OTHER PUBLICATIONS

Written Opinion of the International Search Authority in International application No. PCT/CN2023/078686, mailed on Aug. 6, 2023.
Chinese Office Action issued in corresponding Chinese Patent Application No. 202310099195.9 dated Jul. 19, 2025, pp. 1-12.

* cited by examiner

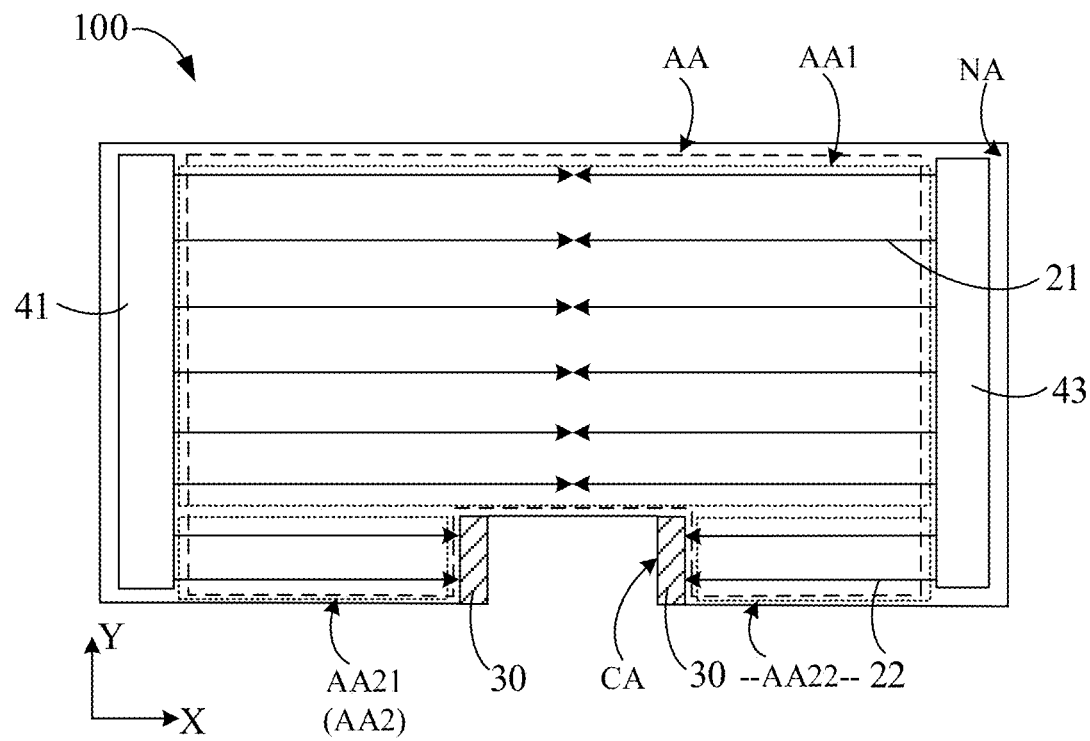
Fig. 7
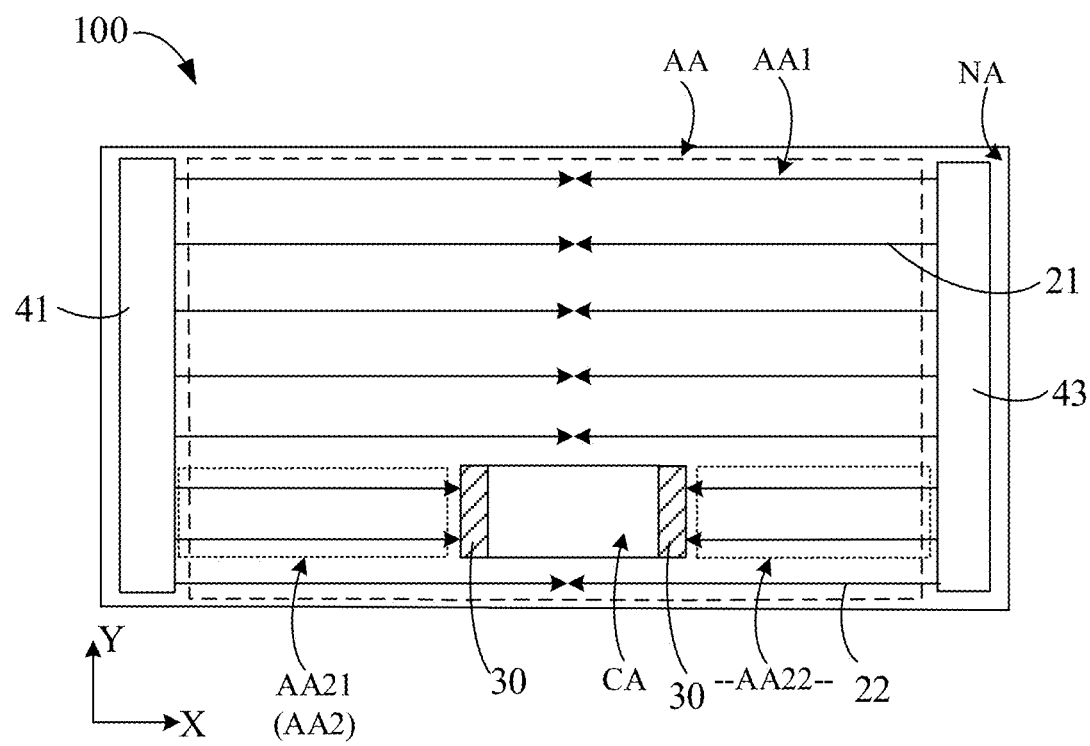
--Fig. 8--

DISPLAY PANEL

CROSS-REFERENCE TO RELATED APPLICATION

This application is a national phase of International Patent Application PCT/CN2023/078686, filed on Feb. 28, 2023, which claims the priority of Chinese Patent Application No. CN202310099195.9, filed on Jan. 31, 2023, which are hereby incorporated by reference in their entirety.

FIELD OF THE INVENTION

The present application relates to the technical field of display, in particular to a display panel.

DESCRIPTION OF THE RELATED ART

With the rapid development of display technology, people's demand for shapes of display panels tends to be diversified. Irregular-shaped display panels have been widely applied. The irregular-shaped display panels are a display panels with special shape (irregular-shaped area) transformed from traditional display panels. However, the existence of irregular-shaped area will cause uneven loading in the display panel, which leads to uneven display.

SUMMARY OF THE INVENTION

Technical Problem

The present application provides a display panel to solve the technical problem of uneven display of the display panel caused by uneven loading in the display panel with the existence of the irregular-shaped area.

Technical Solution

The present application provides a display panel including an active area and a irregular-shaped area, the active area includes a first active area disposed at at least one side of the irregular-shaped area and a second active area connected with the first active area, the display panel includes:
  at least one first signal line disposed in the second active area;
  at least one second signal line disposed in the first active area, the first signal line and the second signal line extend in a same direction, and the length of the first signal line is larger than the length of the second signal line; and
  a compensation circuit including at least one compensation module, the compensation module includes a plurality of compensation units spaced from each other, and at least one of a plurality of the compensation units is connected with the second signal line.

Optionally, in some embodiments of the present application, the compensation module further includes at least one control signal line, the compensation unit includes a switching transistor and a compensation element, a control terminal of the switching transistor is connected with the corresponding control signal line, a first terminal of the switching transistor is connected with the second signal line, and a second terminal of the switching transistor is connected with the compensation element.

Optionally, in some embodiments of the present application, the compensation element includes a capacitor, the second terminal of the switching transistor is connected with a terminal of the capacitor, and the other terminal of the capacitor is connected with a power supply terminal.

Optionally, in some embodiments of the present application, the compensation module includes one of the control signal lines;
  the control terminal of the switching transistor of at least one compensation unit intersects with the control signal line and is disposed in different layers with the control signal line, or the control terminal of at least one of the switching transistors is connected with a first connecting line, the first connecting line intersects with the control signal line and is disposed in different layers with the control signal line.

Optionally, in some embodiments of the present application, a laser mark is disposed on the control signal line, the laser mark is disposed corresponding to the intersection of the control signal line and the control terminal of the switching transistor, or the laser mark is disposed corresponding to the intersection of the control signal line and the first connecting line.

Optionally, in some embodiments of the present application, the compensation circuit includes a plurality of compensation modules, a plurality of the compensation modules share the same control signal line or each control signal line is provided corresponding to each compensation module.

Optionally, in some embodiments of the present application, the compensation module includes a plurality of the control signal lines, each of the control signal lines is connected with at least one compensation unit, and each of the control signal lines is configured to control the electrical connection between the corresponding compensation unit and the second signal line.

Optionally, in some embodiments of the present application, the compensation module further includes a compensation line and a second connecting line, one terminal of the second connecting line is connected with the compensation unit, and the other terminal of the second connecting line intersects with the compensation line and is disposed in different layers with the compensation line.

Optionally, in some embodiments of the present application, the compensation unit includes a capacitor, one terminal of the capacitor is connected with the second connecting line, and the other terminal of the capacitor is connected with a power supply terminal.

Optionally, in some embodiments of the present application, a connection mark is disposed at the intersection of the compensation line and the second connection line.

Optionally, in some embodiments of the present application, the compensation module further includes a resistor, the resistor is connected with the second signal line, the resistance value of the resistor is less than the resistance difference between the first signal line and the second signal line.

Optionally, in some embodiments of the present application, the display panel further includes a border area provided around the active area, and the display panel further includes a first gate driving circuit and a second gate driving circuit both disposed in the border area;
  the first gate driving circuit and the second gate driving circuit are both disposed on a same side of the display panel, the first gate driving circuit is connected with the first signal line, and the second gate driving circuit is connected with the second signal line, the first gate driving circuits are alternately spaced from the second gate driving circuits along the extending direction of the first signal line, and the compensation circuit is disposed at one side of the second signal line close to the second gate driving circuit.

Optionally, in some embodiments of the present application, the display panel further includes a third gate driving circuit, the third gate driving circuit is disposed opposite to the first gate driving circuit and the second gate driving circuit, and the third gate driving circuit is connected with the first signal line and the second signal line respectively.

Optionally, in some embodiments of the present application, the driving current outputted by the first gate driving circuit is equal to the driving current outputted by the third gate driving circuit, and the driving current outputted by the second gate driving circuit is smaller than the driving current outputted by the third gate driving circuit.

Optionally, in some embodiments of the present application, the driving current outputted by the first gate driving circuit, the driving current outputted by the second gate driving circuit, and the driving current outputted by the third gate driving circuit are all the same.

Optionally, in some embodiments of the present application, the compensation circuit is disposed in the border area and/or the active area.

Optionally, in some embodiments of the present application, the display panel further includes a border area provided around the active area, and the display panel further includes a first gate driving circuit and a third gate driving circuit both disposed in the border area, the first gate driving circuit and the third gate driving circuit are disposed at two sides of the active area respectively;

the first active area includes a first sub-active area and a second sub-active area disposed at two sides of the irregular-shaped area respectively, and the first gate driving circuit and the third gate driving circuit are connected with two terminals of the first signal line respectively; in the first sub-active area, the second signal line is connected with the first gate driving circuit, and the compensation circuit is disposed at one side of the second signal line away from the first gate driving circuit; in the second sub-active area, the second signal line is connected with the third gate driving circuit, and the compensation circuit is disposed at the side of the second signal line away from the third gate driving circuit.

Optionally, in some embodiments of the present application, the display panel further includes a border area provided around the active area, and the border area is further bonded with a driving chip, and the driving chip is connected with the first signal line and the second signal line respectively; the compensation circuit is disposed at one side of the second signal line away from the driving chip.

Optionally, in some embodiments of the present application, the second signal line is a data line or a scanning line, the display panel includes a plurality of the data lines and a plurality of the scanning lines;

the compensation circuit includes a plurality of compensation modules, and each of the data lines or each of the scanning lines is connected with one of the compensation modules correspondingly.

Beneficial Effect

The present application discloses a display panel, the display panel includes an active area and a irregular-shaped area, the active area includes a first active area disposed at least on one side of the irregular-shaped area and a second active area connected with the first active area, the display panel includes at least one first signal line, at least one second signal line and a compensation circuit. The first signal line is disposed in the second active area, the second signal line is disposed in the first active area, the first signal line and the second signal line extend in a same direction, and the length of the first signal line is larger than the length of the second signal line, the compensation circuit includes at least one compensation module, the compensation module includes a plurality of compensation units spaced from each other, and at least one of a plurality of the compensation units is connected with the second signal line. In the present application, by providing a compensation circuit, the problem of uneven display caused by the existence of irregular-shaped area can be improved. In addition, since the compensation circuit includes a plurality of compensation units spaced from each other, one or more of the plurality of compensation units can be connected with the second signal line according to actual compensation needs, thus increasing the compensation range for the loading of the second signal line, improving the compensation accuracy, and making up for the defect of uneven display caused by manufacturing process error and change of production line. Furthermore, since a plurality of the compensation units are spaced from each other, the risk of electrostatic caused by the compensation module is reduced.

BRIEF DESCRIPTION OF THE DRAWINGS

FIG. 7 is a schematic diagram of a third structure of the display panel provided in the present application;

FIG. 8 is a schematic diagram of a fourth structure of the display panel provided in the present application;

DETAILED DESCRIPTION OF THE INVENTION

The technical solutions of the embodiments of the present application will be clearly and completely described in the following with reference to the figures in the embodiments of the present application. Apparently, the embodiments described herein are only part of embodiments of the present application but not all of the embodiments of the present application. Based on the embodiments of the present application, all other embodiments obtained by those skilled in the art without creative efforts fall within the protection scope of the present application.

In addition, the terms "first", "second" and the like in the specification and claims of the present application are for distinguishing between different objects and are not for describing a specific order. The terms "including" and "having" and any variations thereof mean non-exclusive inclusion.

The present application provides a display panel, which will be described in detail below. It should be noted that, the description order of the following embodiments is not a limitation to the preferred order of the embodiments of the present application.

Figure 1:
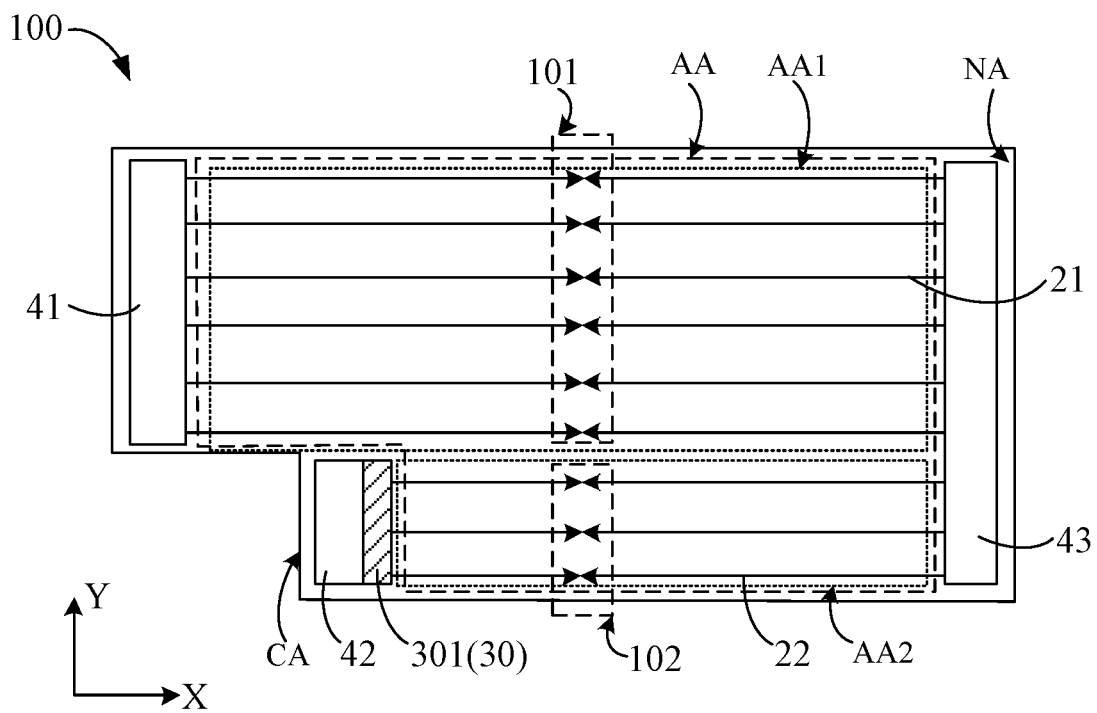
FIG. 1 is a schematic diagram of a first structure of the display panel provided in the present application.
Figure 2:
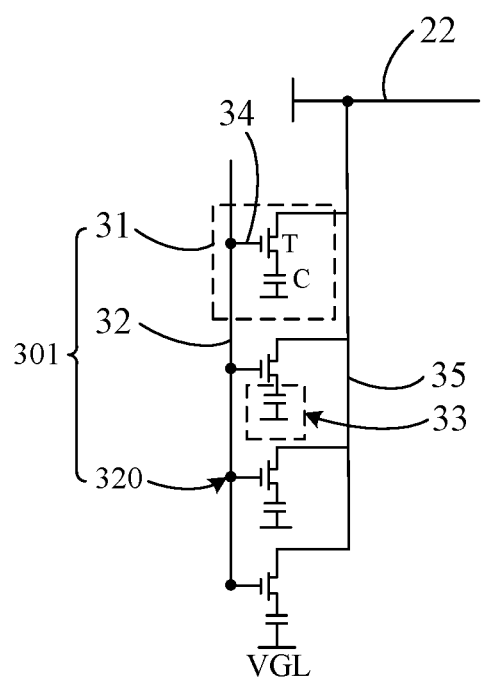
FIG. 2 is a schematic diagram of a first structure with the compensation module and the second signal line provided in the present application.

Refer to FIG. 1 and FIG. 2, FIG. 1 is a schematic diagram of a first structure of the display panel provided in the present application, FIG. 2 is a schematic diagram of a first structure with the compensation module and the second signal line provided in the present application. In the embodiments of the present application, the display panel 100 includes an active area AA and a irregular-shaped area CA. The active area AA includes a first active area AA2 disposed at least on one side of the irregular-shaped area CA and a second active area AA1 connected with the first active area AA2.

The display panel 100 includes at least one first signal line 21, at least one second signal line 22 and a compensation circuit 30. At least one first signal line 21 is disposed in the second active area AA1. At least one second signal line 22 is disposed in the first active area AA2. The first signal line 21 and the second signal line 22 extend in a same direction. The length of the first signal line 21 is larger than the length of the second signal line 22. The compensation circuit 30 includes at least one compensation module 301. The compensation module 301 includes a plurality of compensation units 31 spaced from each other. At least one of a plurality of compensation units 31 is connected with the second signal line 22.

The irregular-shaped area AA2 is formed by grooving the display panel 100. The irregular-shaped area AA2 can be used to equip functional devices such as cameras, earphones, fingerprint identification components and physical keys. The shape and the position of the irregular-shaped area AA2 are not specifically limited in the embodiments of the present application. For example, the cross-sectional shape in the irregular-shaped area AA2 can be rectangular, circular, diamond, square, etc. For example, the irregular-shaped area AA2 can be provided in the upper middle area, the lower middle area, the corner area, etc. of the display panel 100 as long as it is supported by the manufacturing process.

The same compensation module 301 can include two, four, six, seven, or more compensation units 31 to realize segmented compensation for the second signal line 22. The figures of the present application illustrate the compensation module 301 including four compensation units 31 as an example, which should not to be considered as a limitation to the present application.

The first signal line 21 and the second signal line 22 can be a data line, a scanning line or the like. For example, when the first signal line 21 and the second signal line 22 are data lines, the first signal line 21 and the second signal line 22 can be extended in the Y direction. When the first signal line 21 and the second signal line 22 are scanning lines the first signal line 21 and the second signal line 22 can be extended in the X direction. It can be understood that, since the irregular-shaped area AA2 is provided in the display panel 100, the second signal line 22 is disconnected in the irregular-shaped area AA2, resulting in a length of the second signal line 22 being smaller than the length of the first signal line 21 and an uneven loading in the display panel.

In this regard, in the embodiments of the present application, by providing the compensation module 301 connected with the second signal line 22, the resistance-capacitance difference between the first signal line 21 and the second signal line 22 can be reduced, thereby improving the problem of uneven display caused by the irregular-shaped area AA2. In addition, since the compensation circuit 30 includes a plurality of compensation units 31 spaced from each other, one or more of a plurality of the compensation units 31 can be connected with the second signal line 22 according to the actual compensation needs, thereby realizing segmented compensation and increasing the compensation range of loading for the second signal line 22. Furthermore, since a plurality of the compensation units 31 are spaced from each other, the risk of electrostatic caused by a too large area of the compensation module 301 is reduced.

It can be understood that, the simulation results of the loading of the display panel 100 can differ from the measured results due to the manufacturing process differences and the production line differences and the like. In the embodiments of the present application, a plurality of the compensation units 31 required according to the simulation results can be disposed in the display panel 100 in advance. Then, one or more of the compensation units 31 are connected with the second signal line 22 according to the actual test result of the display panel 100, thereby improving the compensation accuracy and making up the problem of uneven display caused by the manufacturing process error and the change of production line and the like.

In the embodiments of the present application, the display panel 100 can include a plurality of first signal lines 21 and a plurality of second signal lines 22. In the embodiments of the present application, a compensation module 301 can be provided for each second signal line 22, or a corresponding number of the compensation module s 301 can be provided according to the actual needs of the display panel 100.

In the embodiments of the present application, the compensation module 301 further includes at least one control signal line 32. The compensation unit 31 includes a switching transistor T and a compensation element 33. A control terminal of the switching transistor T is connected with a corresponding control signal line 32. The first terminal of the switching transistor T is connected with the second signal line 22. The second terminal of the switching transistor T is connected with the compensation element 33.

The control signal line 32 is for receiving a control signal to control the switching status of the switching transistor T, thereby controlling the electrical connection status between the compensation element 33 and the second signal line 22.

It can be understood that, in the embodiments of the present application, by disposing the switching transistor T between the compensation element 33 and the second signal line 22, the electrical connection status between the compensation element 33 and the second signal line 22 can be controlled by the switching transistor T, so that one or more of a plurality of the compensation units 31 can be electrically connected with the second signal line 22 according to actual compensation needs, and the compensation range of the loading for the second signal line 22 is enlarged.

The switching transistor T provided in the embodiments of the present application can be a thin film transistor or a field effect transistor or other device with the same characteristics. The control terminal of the switching transistor T is the gate electrode of the transistor, and the first terminal and the second terminal of the switching transistor T are the source electrode and drain electrode of the transistor, respectively. The source electrode and drain electrode are interchangeable since the source electrode and drain electrode of the transistor used herein are symmetrical.

In addition, the switching transistor T provided in the embodiments of the present application can be a P-type transistor and/or an N-type transistor. The P-type transistors are on when the gate electrode is at a low potential and off when the gate electrode is at a high potential, while the N-type transistors are on when the gate electrode is at a high potential and off when the gate electrode is at a low potential. The transistors T in the following embodiments of the present application are described as examples of N-type transistors but should not be considered as a limitation to the present application.

In the embodiments of the present application, the compensation module 301 can include a control signal line 32. The control terminal of the switching transistor T of at least one compensation unit 31 intersects with the control signal line 32 and is disposed in different layers with the control signal line 32.

It can be understood that, in some embodiments, the control terminals of the switching transistors T corresponding to all the compensation units 31 can be intersected with the control signal lines 32 and disposed in different layers with the control signal lines 32. Thus one or more of the compensation units 31 can be connected with the second signal line 22 selectively according to the actual needs of the display panel 100, thus, accurate compensation for the second signal line 22 can be achieved.

In other embodiments, the control terminal of the switching transistor T of part of the compensation units 31 can be directly connected with the control signal line 32 according to the simulation results. When the control signal is inputted to the control signal line 32, the electrical connection between the compensation element 33 and the second signal line 22 can be realized, thus a predetermined compensation effect can be achieved. Meanwhile, since the control terminals of at least one compensation unit 31 are intersected with the control signal lines 32 and disposed in different layers with the control signal lines 32, if a further compensation for the second signal line 22 is needed based on the actual test results, the control terminals of the part of the compensation unit 31 can be connected with the control signal lines 32 by means of laser process or the like. Therefore, the number of processes such as laser process is reduced, and the risk is reduced.

In the embodiments of the present application, the control terminal of the switching transistor T can be connected with the first connecting line 34. At least one first connecting line 34 intersects with the control signal line 32 and is disposed in different layers with the control signal line 32. Thus, when the first connection line 34 and the control signal line 32 are connected by a laser process, damage to the switching transistor T can be avoided.

In the embodiments of the present application, a laser mark 320 is provided on the control signal line 32. In a direction perpendicular to the display panel 100, the intersection of the control signal line 32 and the control terminal of the switching transistor T can overlap with the laser mark 320. The intersection of the control signal line 32 and the first connecting line 34 can overlap with the laser mark 320.

It can be understood that, the control terminal (the first connecting line 34) of the switching transistor T and the control signal line 32 can be connected together by means of a laser process. Since the laser energy is very high, in order to avoid other film layers being damaged, in the embodiments of the present application, a laser mark 320 is disposed on the control signal line 32, and the laser mark 320 is disposed at the intersection of the control signal line 32 and the control terminal of the switching transistor T, thereby improving the laser process accuracy. The yield of connection between the control terminal of the switching transistor T and the control signal line 32 can be improved and laser damage to other film layers can be avoided.

In addition, the laser mark 320 can be a protrusion or a groove provided on the control signal line 32, the laser marker 320 can also be a graphic marker such as "−", "+", "X" and the like provided on the control signal line 32, which are not specific limitations to the present application.

It should be noted that, when the compensation circuit 30 includes a plurality of compensation module s 301, a plurality of the compensation module s 301 can share the same control signal line 32. A control signal line 32 can also be provided for each corresponding compensation module 301.

In the embodiments of the present application, the compensation element 33 can include a capacitor C. The second terminal of the switching transistor T is connected with one terminal of the capacitor C, and the other terminal of the capacitor C is connected with a power supply terminal VGL. The power supply terminal VGL can be the grounding terminal. The power supply terminal VGL can also be inputted with a low potential voltage with a voltage value greater than 0, which is not a specific limitation to the present application.

It can be understood that, in the display panel 100, each of the first signal lines 21 and the second signal lines 22 will form a parasitic capacitor with the other conductive film in the display panel. Since the length of the second signal line 22 is smaller than the length of the first signal line 21, the parasitic capacitance formed between the second signal line 22 and the other conductive film is smaller than the parasitic capacitance formed between the first signal line 21 and the other conductive film. Therefore, in the embodiments of the present application, the parasitic capacitance differences can be compensated by providing the capacitor C in the compensation element 33.

The capacitor C can be formed using at least two conductive films of a gate metal layer, a source metal layer and a common electrode layer and the like in the display panel 100, thereby simplifying the manufacturing process.

It should be noted that, although the compensation element 33 only includes the capacitor C, each of wirings in the compensation unit 31 can play a role of resistance compensation to a certain extent.

In the embodiments of the present application, the compensation element 33 can include a compensation resistor (not shown) for compensation for a resistance difference between the second signal line 22 and the first signal line 21. The compensation resistor can be a conductive element having a predetermined width and thickness. The compensation resistor can be disposed in the same layer as one of the gate metal layer, the source metal layer, the semiconductor layer, and the common electrode layer in the display panel.

In the embodiments of the present application, the compensation module 301 can further include a compensation line 35. The compensation line 35 is connected with the second signal line 22. The first terminal of the switching transistor T is connected with the compensation line 35. That is, a plurality of the compensation units 31 are connected with the second signal line 22 through the compensation line 35.

In the embodiments of the present application, by providing the compensation line 35, compensation for resistance can be achieved. Meanwhile, since the second signal line 22 is disposed in the active area AA, the compensation unit 31 can be disposed in the non-active area with the compensation line 35 to avoid the display effect being affected.

Figure 3:
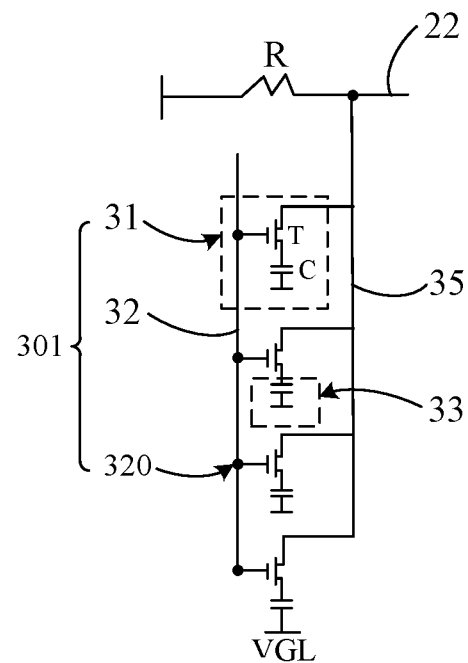
FIG. 3 is a schematic diagram of a second structure with the compensation module and the second signal line provided in the present application.

Refer to FIG. 3, FIG. 3 is a schematic diagram of a second structure with the compensation module and the second signal line provided in the present application. Different from the compensation module 301 shown in FIG. 2, in the present embodiment, the compensation module 301 further includes a resistor R. The resistor R is connected with the second signal line 22. The resistance value of the resistor R is smaller than the resistance difference between the first signal line 21 and the second signal line 22.

It can be understood that, the loading difference caused by the first signal line 21 and the second signal line 22 is mainly a resistance difference. Since the length of the first signal line 21 is larger than the length of the second signal line 22, the resistance value of the first signal line 21 is larger than the resistance value of the second signal line 22. In the embodiments of the present application, by disposing the resistor R, a direct compensation for the resistance difference between the first signal line 21 and the second signal line 22 can be achieved.

In the compensation module 301, since the compensation element 33 in the compensation unit 31 can include a capacitor C, by providing the resistor R and the compensation element 33, the RC loading difference caused by the first signal line 21 and the second signal line 22 can be compensated at the same time, thereby improving the compensation effect. In addition, the wirings in the compensation element 33 can further play a role of resistance compensation to a certain extent, so that the resistance value of the resistor R is smaller than the resistance difference between the first signal line 21 and the second signal line 22.

Figure 4:
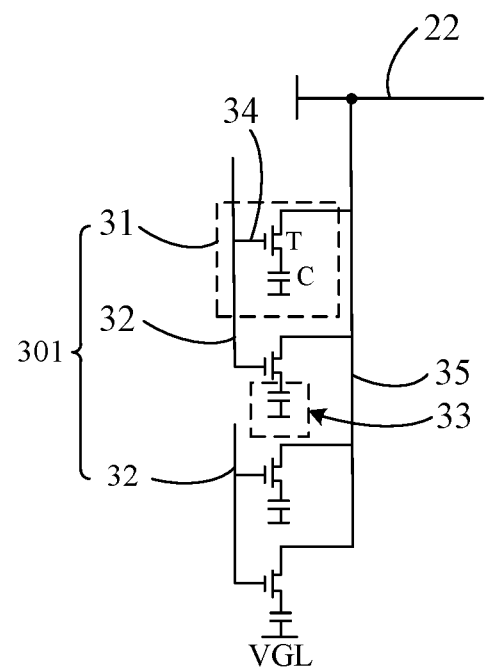
FIG. 4 is a schematic diagram of a third structure with the compensation module and the second signal line provided in the present application.

Refer to FIG. 4, FIG. 4 is a schematic diagram of a third structure with the compensation module and the second signal line provided in the present application. Different from the compensation module 301 shown in FIG. 2, in the present embodiment, the compensation module 301 includes a plurality of control signal lines 32. Each of the control signal lines 32 is connected with at least one compensation unit 31. Each of the control signal lines 32 controls the electrical connection between the corresponding compensation unit 31 and the second signal line 22.

For example, in some embodiments, a plurality of the control signal lines 32 are connected with a plurality of the compensation units 31 in one-to-one correspondence. Thus, each of the control signal lines 32 controls the electrical connection between a compensation unit 31 and the second signal line 22.

For example, in some embodiments, each of the control signal lines 32 is connected with two or three of the compensation units 31. Thus, each of the control signal lines 32 controls the electrical connection between two or three of the compensation units 31 and the second signal line 22 at the same time.

Specifically, when the second signal line 22 is compensated according to the actual test result of the display panel 100, the corresponding compensation unit 31 can be connected with the second signal line 22 by supplying control signals to the control signal line 32. Therefore, the electrical connection between the compensation unit 31 and the second signal line 22 by laser process will no longer be necessary, thereby simplifying the manufacturing process and improving the process safety.

Figure 5:
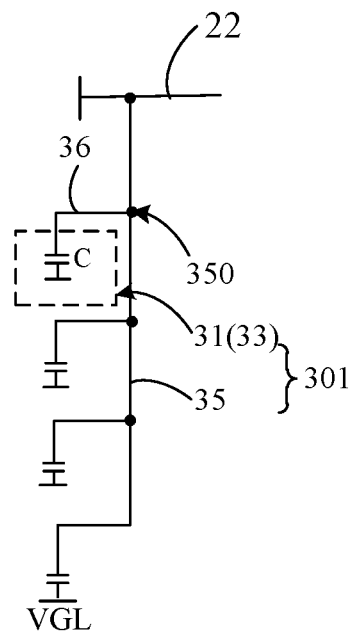
FIG. 5 is a schematic diagram of a fourth structural with the compensation module and the second signal line provided in the present application.

Refer to FIG. 5, FIG. 5 is a schematic diagram of a fourth structural with the compensation module and the second signal line provided in the present application. Different from the compensation module 301 shown in FIG. 2, in the present embodiment, the compensation module 301 further includes a compensation line 35 and a second connecting line 36. One terminal of the second connecting line 36 is connected with the compensation unit 31. The other terminal of the second connecting line 36 intersects with the compensation line 35 and is disposed in different layers with the compensation line 35.

The compensation unit 31 includes a compensation element 33. The compensation element 33 can include a capacitor C. One terminal of the capacitor C is connected with the second connecting line 36. The other terminal of the capacitor C is connected with a power supply terminal VGL.

The connection mark 350 can be disposed at a position where the compensation line 35 intersects with the second connection line 36. The second connection line 36 and the compensation line 35 can be connected together by laser process at the connection mark 350, thereby electrical connection between the compensation unit 31 and the second signal line 22 can be achieved. It should be noted that, the functions and features of the connection mark 350 are the same as those of the laser mark 320 in the above-described embodiments.

In the embodiments of the present application, the control signal line 32 and the switching transistor T in the embodiment shown in FIG. 2 can be omitted by intersecting the second connection line 36 with the compensation line 35 and by disposing the second connection line 36 and the compensation line 35 in different layers, thereby simplifying the circuit structure of the compensation circuit 30.

Refer to FIG. 1 and FIG. 2, the following embodiments of the present application will be described with the first signal line 21 and the second signal line 22 being took as scanning lines as examples.

In the embodiments of the present application, the display panel 100 further includes a border area NA provided around the active area AA. The display panel 100 further includes a first gate driving circuit 41 and a second gate driving circuit 42 both disposed in the border area NA.

The first gate driving circuit 41 and the second gate driving circuit 42 are both disposed on the same side of the display panel 100. The first gate driving circuit 41 is connected with the first signal line 21. The second gate driving circuit 42 is connected with the second signal line 22. The first gate driving circuit 41 and the second gate driving circuit 42 are staggered from each other along the extending direction of the first signal line 21. The compensation circuit 30 is disposed on one side of the second signal line 22 close to the second gate driving circuit 42.

The border area NA can be an active area or a non-active area and can be designed according to the actual needs of the display panel 100.

The first gate driving circuit 41 and the second gate driving circuit 42 can be gate driving chips or GOA (Gate-dirvers On Array) circuits.

The irregular-shaped area CA is disposed in the lower left corner of the display panel 100. That is, a grooving process is performed in the lower left corner of the display panel 100. The first gate driving circuit 41 and the second gate driving circuit 42 are both disposed on the same side of the display panel 100 due to the existence of the irregular-shaped area CA, the first gate driving circuit 41 and the second gate driving circuit 42 are staggered from each other along the X direction.

The compensation circuit 30 is disposed on the side of the second signal line 22 close to the second gate driving circuit 42. Specifically, the compensation circuit 30 can be disposed in the border area NA together with the second gate driving circuit 42. The compensation circuit 30 can also be disposed in the active area AA. The compensation circuit 30 can also be disposed in the border area NA and the active area AA at the same time. The embodiments of the present application will be explained with the compensation circuit 30 being disposed in the border area NA as examples.

It can be understood that the second gate driving circuit 42 can include a plurality of output terminals to output scanning signals to the second signal line 22. Each of the compensation modules 301 can be disposed between the output terminal of the second gate driving circuit 42 and the second signal line 22, so that the losses of the scan signals received by the first signal line 21 and the second signal line 22 are the same and the display uniformity is improved.

In some embodiments, if the compensation circuit 30 is disposed in the border area NA, in order to ensure a width consistency of the border area NA of the display panel 100, the size of the second gate driving circuit 42 can be reduced to increase the wirings space for the compensation circuit 30.

Furthermore, in the embodiments of the present application, the display panel 100 can further include a third gate driving circuit 43. The third gate driving circuit 43 is disposed opposite to the first gate driving circuit 41 and the second gate driving circuit 42. The third gate driving circuit 43 is connected with the first signal line 21 and the second signal line 22 respectively. That is, the display panel 100 provided in the embodiments of the present application employs a double-side driving mode.

In the embodiments of the present application, the driving ability of the first gate driving circuit 41 is equal to the driving ability of the third gate driving circuit 43. The driving ability of the second gate driving circuit 42 is smaller than the driving ability of the third gate driving circuit 43.

The driving ability of gate driving circuit depends on the outputted current, therefore the larger the outputted current, the greater the driving ability. When the gate driving circuit is a gate driving chip, the outputted current can be adjusted by the internal circuit structure of the gate driving chip. When the gate drive circuit is a GOA circuit, since the outputted current of the GOA circuit is related to the size of the transistor in the pull-up output unit, the larger the width to length ratio of the channel of the transistor, the greater the source-drain current, therefore, the driving ability of the GOA circuit can be adjusted by adjusting the transistor size in the GOA circuit.

It can be understood that, since the double-side driving mode is employed, and the driving ability of the first gate driving circuit 41 is equal to the driving ability of the third gate driving circuit 43, therefore, the driving ability of the scanning signals transmitted to the first central portion 101 of the second active area AA1 from both sides is the weakest. In the embodiments of the present application, since the length of the second signal line 22 is smaller than the length of the first signal line 21, by providing the driving ability of the first gate driving circuit 41 smaller than the driving ability of the third gate driving circuit 43, the driving ability of the scanning signals transmitted to the second central portion 102 of the first active area AA2 from both sides is also the weakest. The first central portion 101 and the second central portion 102 are provided in the same coordinate area in the X direction, thereby ensuring the display uniformity of the second active area AA1 and the first active area (abnormal active area) AA2.

Figure 6:
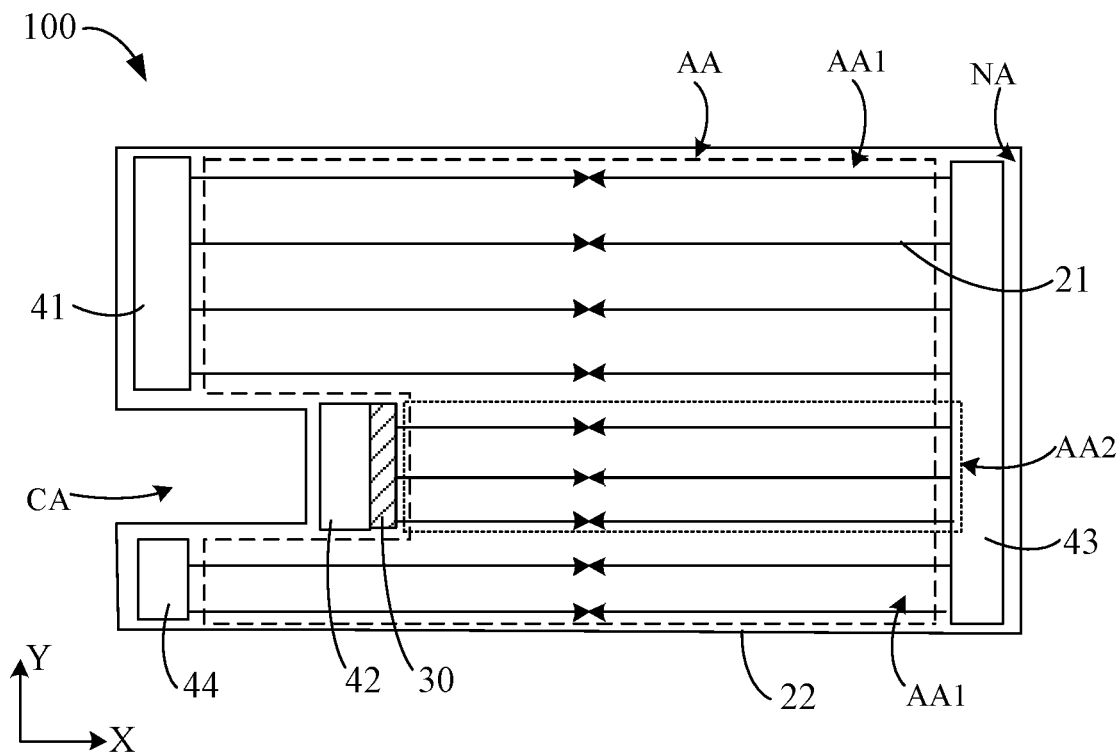
FIG. 6 is a schematic diagram of a second structure of the display panel provided in the present application.

Refer to FIG. 6, FIG. 6 is a schematic diagram of a second structure of the display panel provided in the present application. Different from the display panel 100 shown in FIG. 5, in the present embodiment, the display panel 100 further includes a fourth gate driving circuit 44 disposed in the border area NA.

The irregular-shaped area CA is provided in the left middle area of the display panel 100, so that the second active area AA1 is provided on both sides of the first active area (the abnormal active area) AA2. The compensation circuit 30 is disposed on the side of the second signal line 22 close to the second gate driving circuit 42.

Refer to FIG. 7, FIG. 7 is a schematic diagram of a third structure of the display panel provided in the present application. Different from the display panel 100 shown in FIG. 5, in the present embodiment, the display panel 100 includes a first gate driving circuit 41 and a third gate driving circuit 43 both disposed in the border area NA. The first gate driving circuit 41 and the third gate driving circuit 43 are respectively provided on both sides of the active area AA.

The first active area AA2 includes a first sub-active area AA21 and a second sub-active area AA22 respectively located on both sides of the irregular-shaped area CA. The first gate driving circuit 41 and the third gate driving circuit 43 are respectively connected with both terminals of the first signal line 21. In the first sub-active area AA1, a second signal line 22 is connected with the first gate driving circuit 41, a compensation circuit 30 is disposed on one side of the second signal line 22 away from the first gate driving circuit 41. In the second sub-active area AA22, a second signal line 22 is connected with the third gate driving circuit 43, a compensation circuit 30 is disposed on one side of the second signal line 22 away from the third gate driving circuit 43.

The irregular-shaped area CA is provided in a lower middle area of the display panel 100, so that the first active area AA2 includes a first sub-active area AA21 and a second sub-active area AA22 respectively provided on both sides of the irregular-shaped area CA.

It can be understood that, since the irregular-shaped area CA is provided in the lower middle region of the display panel 100, the first signal lines 21 and the second signal lines 22 are aligned close to the first gate driving circuit 41, and the first signal lines 21 and the second signal lines 22 are aligned close to the terminals of the third gate driving circuit 43. Therefore, the losses of the scanning signals outputted to the start terminals of the first signal line 21 and the second signal line 22 are the same. Thus, by providing the compensation circuit 30 on the side of the second signal line 22 away from the first gate driving circuit 41 (the third gate driving circuit 43), the display uniformity of the display panel 100 is improved, and compensation for the uneven loading of the display panel 100 is achieved.

Refer to FIG. 8, FIG. 8 is a schematic diagram of a fourth structure of the display panel provided in the present application. Different from the display panel 100 shown in FIG. 7, in the present embodiment, the irregular-shaped area CA is provided in the middle area of the display panel 100. The second active area AA1 is provided on both sides of the first sub-active area AA21 and the second sub-active area AA22 along the Y direction.

Figure 9:
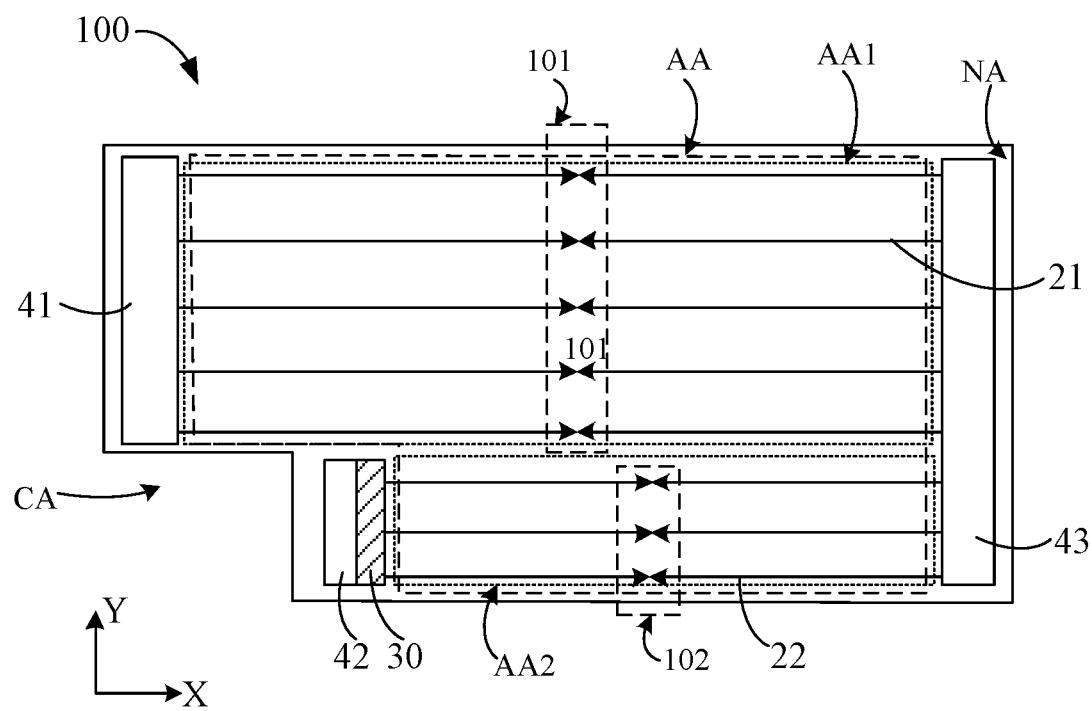
FIG. 9 is a schematic diagram of a fifth structure of the display panel provided in the present application.

Refer to FIG. 9, FIG. 9 is a schematic diagram of a fifth structure of the display panel provided in the present application. Different from the display panel 100 shown in FIG. 1, in the present embodiment, the driving ability of the first gate driving circuit 41, the driving ability of the second gate driving circuit 42, and the driving ability of the third gate driving circuit 43 are all the same.

In the embodiments of the present application, since the double-side driving mode is employed, the driving ability of the first gate driving circuit 41 is equal to the driving ability of the third gate driving circuit 43 in the second active area AA1, therefore, the driving ability of the scanning signals transmitted to the first central portion 101 from both sides is the weakest. In the first active area AA2, since the length of the second signal line 22 is smaller than the length of the first signal line 21, by providing the driving ability of the first gate driving circuit 41 equal to the driving ability of the third gate driving circuit 43, the driving ability of the scanning signals transmitted to the second central portion 102 from both sides is also the weakest. The first center portion 101 and the second center portion 102 are provided in different coordinate areas along the X direction, thereby preventing the problem of vertical non-uniformity of images provided by the display panel 100.

Figure 10:
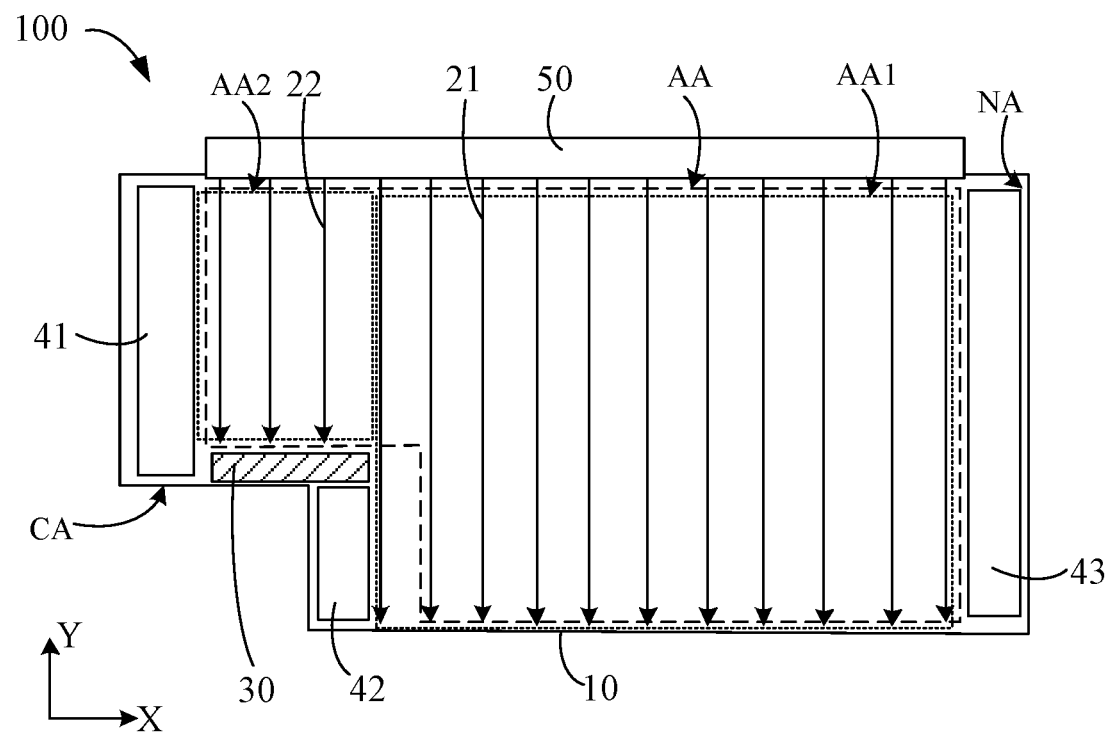
FIG. 10 is a schematic diagram of a sixth structure of the display panel provided in the present application.

Refer to FIG. 10, FIG. 10 is a schematic diagram of a sixth structure of the display panel provided in the present application. The first signal line 21 and the second signal line 22 are took as data lines as examples in the following embodiments of the present application.

The border area NA of the display panel 100 is bonded with a driving chip 50. The driving chip 50 is connected with the first signal line 21 and the second signal line 22 respectively. The compensation circuit 30 is disposed on one side of the second signal line 22 away from the driving chip 50.

The driving chip 50 can be provided in the Border area NA or can be bent to the back of the display panel 100, which is not specifically limited in the embodiments of the present application.

When the first signal line 21 and the second signal line 22 are data lines, in the embodiments of the present application, by connecting a compensation circuit 30 with the second signal line 22, compensation for the loading difference of a plurality of data lines can be achieved, thereby improving the display uniformity of the display panel 100.

It should be noted that, the specific configuration of the compensation circuit 30 can be referred to the above embodiments. The difference is that when the first signal line 21 and the second signal line 22 are the data lines, the compensation module 301 can exclude the resistor R as shown in FIG. 3.

It can be understood that, since the first signal lines 21 and the second signal lines 22 are aligned close to the terminals of the driving chip 50, the losses of the data signals outputted to the start terminals of the first signal lines 21 and the second signal lines 22 are the same. Therefore, a resistor R for compensation for the resistance difference between the first signal line 21 and the second signal line 22 is unnecessary.

It should be noted that, in the embodiments of the present application, the first signal line 21 and the second signal line 22 are described as scanning lines or data lines as examples, it should not be considered as a limitation to the present application. Other signal lines in the display panel 100 with uneven loading due to the design of the irregular-shaped area CA can also employ the solutions as described in the embodiments of the present application.

Figure 11A:
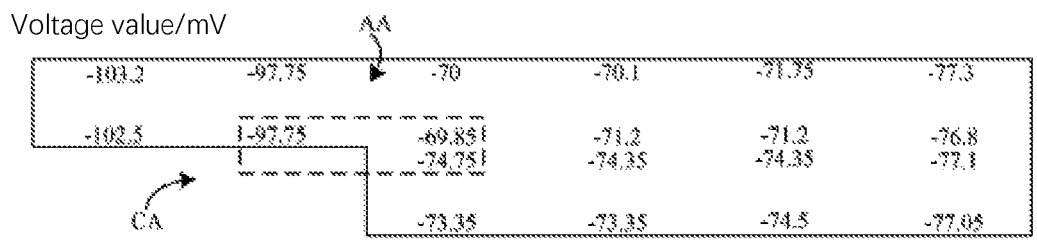
FIGS. 11A-11B are schematic diagrams of voltage value distribution of the display panel shown in FIG. 1 before compensation.
Figure 11B:
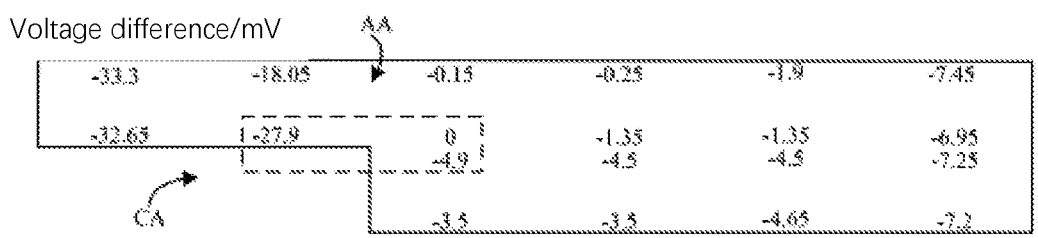
Figure 12A:
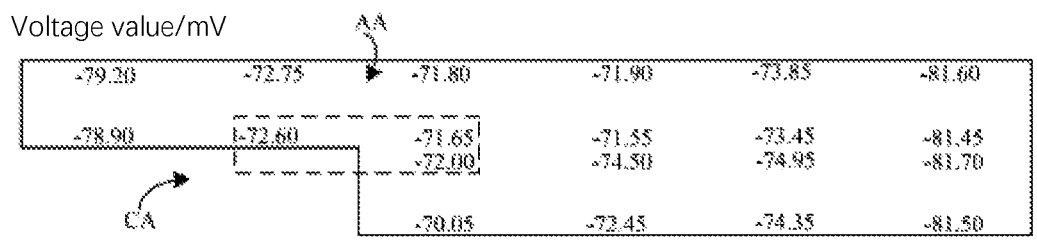
FIGS. 12A-12B are schematic diagrams of voltage value distribution of the display panel shown in FIG. 1 after compensation.
Figure 12B:
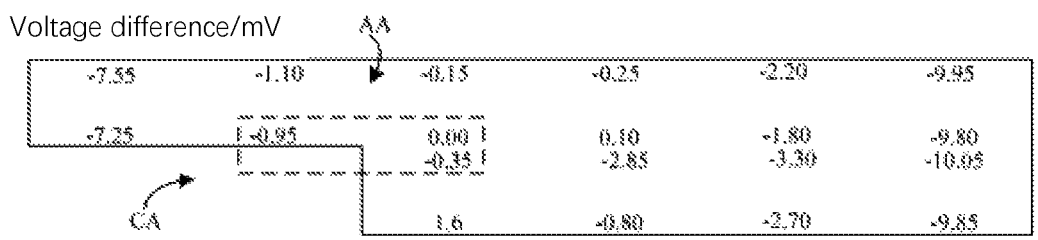

Refer to FIG. 1, FIGS. 11A-11B are schematic diagrams of voltage value distribution of the display panel shown in FIG. 1 before compensation, FIGS. 12A-12B are schematic diagrams of voltage value distribution of the display panel shown in FIG. 1 after compensation.

FIG. 11A shows the voltage value distribution at each position in the display panel 100 before compensation (the voltage value magnitude can represent the display brightness of the display panel 100), and FIG. 11B shows the voltage difference distribution at each position in the display panel 100 calculated according to the voltage value as shown in FIG. 11A. At the junction of the active area AA and the irregular-shaped area CA as shown within the dotted box in the figure, the voltage difference is −27.9 m V in X direction and −4.9 in Y direction with 69.85 mV as a reference.

Similarly, FIG. 12A shows the voltage value distribution at each position in the display panel 100 after compensation, and FIG. 12B shows the voltage difference value distribution at each position in the display panel 100 calculated according to the voltage value as shown in FIG. 12A. At the junction of the active area AA and the irregular-shaped area CA as shown within the dotted box in the figure, the voltage difference is 0 mV in X direction and −0.35 mV in Y direction with 71.65 mV as a reference.

The smaller the voltage difference, the better the display uniformity of the display panel 100. Therefore, the loading difference within the display panel 100 is better improved after compensation.

The embodiments of the present application are described in detail above. The principle and implementation of the present application are illustrated with specific examples in the specification. The above embodiments is only for better understanding of the method and the core idea of the present application, and it should not be considered as a limitation to the protection scope of the present application. Any equivalent transformations of structure or equivalent processes made by using the specification and figures of the present application, or direct or indirect applications to other related technical fields, shall fall within the protection scope of the present application.

What is claimed is:

1. A display panel comprising an active area and an irregular-shaped area, wherein the active area comprises a first active area disposed at at least one side of the irregular-shaped area and a second active area connected with the first active area, the display panel comprises:
    at least one first signal line disposed in the second active area;
    at least one second signal line disposed in the first active area, wherein the first signal line and the second signal line extend in a same direction, and the length of the first signal line is larger than the length of the second signal line; and
    a compensation circuit comprising at least one compensation module, wherein the compensation module comprises a plurality of compensation units spaced from each other, and at least one of a plurality of the compensation units is connected with the second signal line;
    wherein the compensation module further comprises at least one control signal line, the compensation unit comprises a switching transistor and a compensation element, a control terminal of the switching transistor is connected with the corresponding control signal line, a first terminal of the switching transistor is connected with the second signal line, and a second terminal of the switching transistor is connected with the compensation element.

2. The display panel according to claim 1, wherein the compensation element comprises a capacitor, the second terminal of the switching transistor is connected with a terminal of the capacitor, and the other terminal of the capacitor is connected with a power supply terminal.

3. The display panel of claim 1, wherein the compensation module comprises one of the control signal lines;
wherein the control terminal of the switching transistor of at least one compensation unit intersects with the control signal line and is disposed in different layers with the control signal line, or the control terminal of at least one of the switching transistors is connected with a first connecting line, the first connecting line intersects with the control signal line and is disposed in different layers with the control signal line.

4. The display panel according to claim 3, wherein a laser mark is disposed on the control signal line, the laser mark is disposed corresponding to the intersection of the control signal line and the control terminal of the switching transistor, or the laser mark is disposed corresponding to the intersection of the control signal line and the first connecting line.

5. The display panel according to claim 3, wherein the compensation circuit comprises a plurality of compensation modules, a plurality of the compensation modules share the same control signal line or each control signal line is provided corresponding to each compensation module.

6. The display panel according to claim 1, wherein the compensation module comprises a plurality of the control signal lines, each of the control signal lines is connected with at least one compensation unit, and each of the control signal lines is configured to control the electrical connection between the corresponding compensation unit and the second signal line.

7. The display panel according to claim 1, wherein the compensation module further comprises a resistor, the resistor is connected with the second signal line, the resistance value of the resistor is less than the resistance difference between the first signal line and the second signal line.

8. The display panel of claim 1, wherein the display panel further comprises a border area provided around the active area, and the display panel further comprises a first gate driving circuit and a second gate driving circuit both disposed in the border area;
wherein, the first gate driving circuit and the second gate driving circuit are both disposed on a same side of the display panel, the first gate driving circuit is connected with the first signal line, and the second gate driving circuit is connected with the second signal line, the first gate driving circuits are alternately spaced from the second gate driving circuits along the extending direction of the first signal line, and the compensation circuit is disposed at one side of the second signal line close to the second gate driving circuit.

9. The display panel according to claim 8, wherein the display panel further comprises a third gate driving circuit, the third gate driving circuit is disposed opposite to the first gate driving circuit and the second gate driving circuit, and the third gate driving circuit is connected with the first signal line and the second signal line respectively.

10. The display panel of claim 9, wherein a driving current outputted by the first gate driving circuit is equal to a driving current outputted by the third gate driving circuit, and a driving current outputted by the second gate driving circuit is smaller than the driving current outputted by the third gate driving circuit.

11. The display panel according to claim 9, wherein a driving current outputted by the first gate driving circuit, a driving current outputted by the second gate driving circuit, and a driving current outputted by the third gate driving circuit are all the same.

12. The display panel of claim 8, wherein the compensation circuit is disposed in the border area and/or the active area.

13. The display panel according to claim 1, wherein the display panel further comprises a border area provided around the active area, and the display panel further comprises a first gate driving circuit and a third gate driving circuit both disposed in the border area, the first gate driving circuit and the third gate driving circuit are disposed at two sides of the active area respectively;
wherein the first active area comprises a first sub-active area and a second sub-active area disposed at two sides of the irregular-shaped area respectively, and the first gate driving circuit and the third gate driving circuit are connected with two terminals of the first signal line respectively;
wherein, in the first sub-active area, the second signal line is connected with the first gate driving circuit, and the compensation circuit is disposed at one side of the second signal line away from the first gate driving circuit;
wherein, in the second sub-active area, the second signal line is connected with the third gate driving circuit, and the compensation circuit is disposed at the side of the second signal line away from the third gate driving circuit.

14. The display panel according to claim 1, wherein the display panel further comprises a border area provided around the active area, and the border area is further bonded with a driving chip, and the driving chip is connected with the first signal line and the second signal line respectively;
wherein the compensation circuit is disposed at one side of the second signal line away from the driving chip.

15. The display panel of claim 1, wherein the second signal line is a data line or a scanning line, the display panel comprises a plurality of the data lines and a plurality of the scanning lines;
wherein the compensation circuit comprises a plurality of compensation modules, and each of the data lines or each of the scanning lines is connected with one of the compensation modules correspondingly.

16. A display panel comprising an active area and an irregular-shaped area, wherein the active area comprises a first active area disposed at at least one side of the irregular-shaped area and a second active area connected with the first active area, the display panel comprises:
at least one first signal line disposed in the second active area;
at least one second signal line disposed in the first active area, wherein the first signal line and the second signal line extend in a same direction, and the length of the first signal line is larger than the length of the second signal line; and
a compensation circuit comprising at least one compensation module, wherein the compensation module comprises a plurality of compensation units spaced from each other, and at least one of a plurality of the compensation units is connected with the second signal line;
wherein the compensation module further comprises a compensation line and a second connecting line, one terminal of the second connecting line is connected with the compensation unit, and the other terminal of the second connecting line intersects with the compensation line and is disposed in different layers with the compensation line.

17. The display panel according to claim 16, wherein the compensation unit comprises a capacitor, one terminal of the capacitor is connected with the second connecting line, and the other terminal of the capacitor is connected with a power supply terminal.

18. The display panel according to claim 16, wherein a connection mark is disposed at the intersection of the compensation line and the second connection line.

* * * * *